United States Patent
Zou et al.

(10) Patent No.: US 6,750,653 B1
(45) Date of Patent: Jun. 15, 2004

(54) KNEE/FOOT/ANKLE COMBINATION COIL FOR MRI SYSTEMS

(75) Inventors: Mark X. Zou, Aurora, OH (US); Jie Wang, Hudson, OH (US)

(73) Assignee: USA Instruments, Inc., Aurora, OH (US)

(*) Notice: Subject to any disclaimer, the term of this patent is extended or adjusted under 35 U.S.C. 154(b) by 0 days.

(21) Appl. No.: 10/115,527

(22) Filed: Apr. 3, 2002

Related U.S. Application Data

(60) Provisional application No. 60/281,191, filed on Apr. 3, 2001.

(51) Int. Cl.[7] .................................................. G01V 3/00
(52) U.S. Cl. ........................ 324/318; 324/322; 600/422
(58) Field of Search ................................ 324/318, 309; 600/422, 415, 425

(56) References Cited

U.S. PATENT DOCUMENTS

| | | | |
|---|---|---|---|
| 4,680,548 A | 7/1987 | Edelstein et al. ............ 324/318 |
| 4,692,705 A | 9/1987 | Hayes ........................ 324/318 |
| 4,825,162 A | 4/1989 | Roemer et al. ............. 324/318 |
| 5,277,183 A | * 1/1994 | Vij ............................. 600/422 |
| 5,349,956 A | * 9/1994 | Bonutti ...................... 600/425 |
| 5,361,764 A | * 11/1994 | Reynolds et al. ........... 600/422 |
| 5,577,503 A | * 11/1996 | Bonutti ...................... 600/415 |
| 5,640,958 A | * 6/1997 | Bonutti ...................... 600/415 |
| 5,743,264 A | * 4/1998 | Bonutti ...................... 600/415 |
| 6,137,291 A | * 10/2000 | Szumowski ................ 324/318 |

* cited by examiner

*Primary Examiner*—Diego Gutierrez
*Assistant Examiner*—Tiffany A. Fetzner
(74) *Attorney, Agent, or Firm*—Carl B. Horton, Esq.; Armstrong Teasdale, LLP

(57) ABSTRACT

A MRI RF coil for use on a human leg having a knee, ankle and foot. The coil includes a knee coil section and a foot/ankle coil section. The sections are configurable into a boot-like structure.

5 Claims, 4 Drawing Sheets

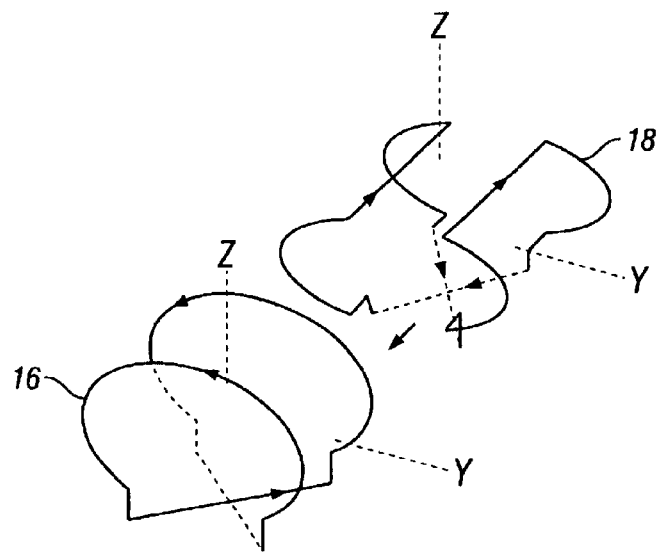
FIG. 5
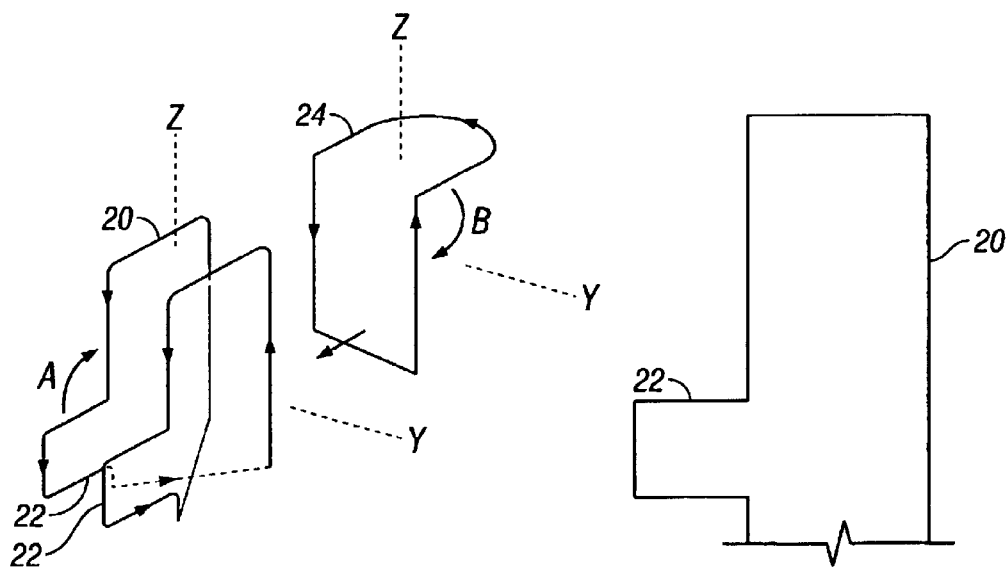
FIG. 6   FIG. 7

KNEE/FOOT/ANKLE COMBINATION COIL FOR MRI SYSTEMS

CROSS-REFERENCE TO RELATED APPLICATION

This application claims the benefit of U.S. provisional patent application Serial No. 60/281,191 filed Apr. 3, 2001.

BACKGROUND OF THE INVENTION

The present invention relates to magnetic resonance imaging systems and, in particular, to the radio frequency coils used in such systems.

Magnetic resonance imaging (MRI) utilizes hydrogen nuclear spins of the water molecules in the human body, which are polarized by a strong, uniform, static magnetic field from the main magnet system (named $B_0$—the main magnetic field in MRI physics). The magnetically polarized nuclear spins generate i; magnetic moments in the human body. The magnetic moments point in the direction of the main magnetic field in a steady state, and produce no useful information if they are not disturbed by any excitation.

The generation of the nuclear magnetic resonance (NMR) signal for MRI data acquisition is accomplished by exciting the magnetic moments with a uniform radio frequency (RF) magnetic field (named $B_1$ field or the excitation field). The $B_1$ field is produced in the imaging region of interest by an RF transmit coil which is driven by a computer-controlled RF transmitter with a power amplifier. During excitation, the nuclear spin system absorbs magnetic energy, and the magnetic moments precess around the direction of the main magnetic field. After excitation, the precessing magnetic moments will go through a process of free induction decay (FID), releasing their absorbed energy and returning to the steady state. During the FID, NMR signals are detected by the use of a receive RF coil, which is placed in the vicinity of the excited volume of the human body. The NMR signal is the secondary electrical voltage (or current) in the receive RF coil that has been induced by the precessing magnetic moments of the human tissue. The receive RF coil can be either the transmit coil itself, or an independent receive-only RF coil. The NMR signal is used for producing MR images by using additional pulsed magnetic gradient fields, which are generated by gradient coils integrated inside the main magnet system. The gradient fields are used to spatially encode the signals and selectively excite a specific volume of the human body. There are usually three sets of gradient coils in a standard MRI system, which generate magnetic fields in the same direction of the main magnetic field, varying linearly in the imaging volume.

In MRI, it is desirable for the excitation and reception to be spatially uniform in the imaging volume for better image uniformity. In a standard MRI system, the best excitation field homogeneity is usually obtained by using a whole-body volume RF coil for transmission. The whole-body transmit coil is the largest RF coil in the system. A large coil, however, produces lower signal-to-noise ratio (SNR) if it is also used for reception, mainly because of its greater distance from the signal-generating tissues being imaged. Since a high SNR ratio is the most desirable in MRI, special-purpose coils are used for RF reception to enhance the SNR from the volume of interest.

In practice, a well-designed specialty RF coil should have the following functional properties: high SNR, good uniformity, high unloaded quality factor (Q) of the resonance circuit, and high ratio of the unloaded to loaded Q factors. In addition, the coil device must be mechanically designed to facilitate patient handling and comfort, and to provide a protective barrier between the patient and the RF electronics. Another way to increase the SNR is by quadrature reception. In this method, NMR signals are detected in two orthogonal directions, which are in the transverse plane or perpendicular to the main magnetic field. The two signals are detected by two independent individual coils that cover the same volume of interest. With quadrature reception, the SNR can be increased by a factor of up to the square root of 2 over that of the individual linear coils.

Most of currently available knee coils are designed to image the knee only and foot/ankle coils (e.g., U.S. Pat. No. 5,361,764) to image the foot and ankle only.

U.S. Pat. No. 5,277,183, which is incorporated herein by reference, shows a coil that performs all three functions, but the coil design makes compromises between clinical versatility and imaging performance. This coil modifies the shape of a standard birdcage coil (U.S. Pat. No. 4,680,548) for receiving the toes of the foot when the foot is placed in the knee coil. The appendant volume for receiving the toes is shaped like a chimney, and therefore the coil has a nickname of "chimney coil". One major drawback is that the chimney coil design deviates from the optimized birdcage structure, and therefore the RF current pattern is not optimized for the best image uniformity and SNR. The second major disadvantage is that the chimney coil does not work in MRI systems with have a vertical main magnetic field. Another drawback of the chimney coil is that it does not offer enough coverage for imaging the foot and ankle without sacrificing the image quality of the knee.

SUMMARY OF THE INVENTION

A MRI RF coil for use on a human leg having a knee, ankle and foot. The coil includes a knee coil section and a foot/ankle coil section. The sections are configurable into a boot-like structure.

BRIEF DESCRIPTION OF THE DRAWINGS

FIG. 5 is a perspective schematic view of exemplary coil traces in a knee coil section according to the invention. The coil elements are shown spaced apart for ease of understanding.

FIG. 6 is a perspective schematic view of exemplary coil traces in a foot/ankle coil section according to the invention. The coil elements are shown spaced apart for ease of understanding.

FIG. 7 is a side elevation cross sectional view of the solenoidal coil of FIG. 6.

DESCRIPTION OF THE PREFERRED EMBODIMENTS

Figure 1:
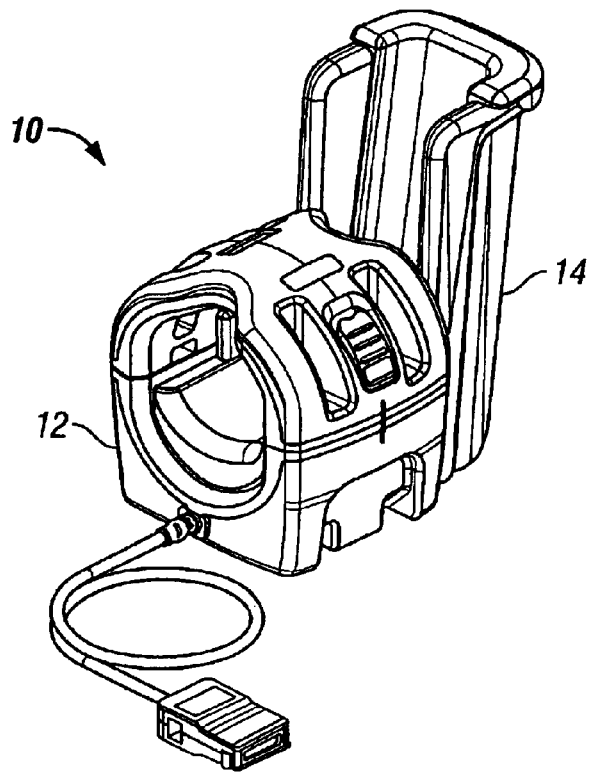
FIG. 1 is a perspective view of a coil according to the invention.

Referring to FIG. 1, a MRI RF coil 10 includes a knee coil section 12 and an independent foot/ankle coil section 14.

Each of the sections 12, 14 may be, for example, linear or quadrature (for quadrature reception) volume coils or coil arrays, for example a quadrature or linear knee coil section (or coil array) and a quadrature or linear foot/ankle coil coils section (or coil array).

Figure 2:
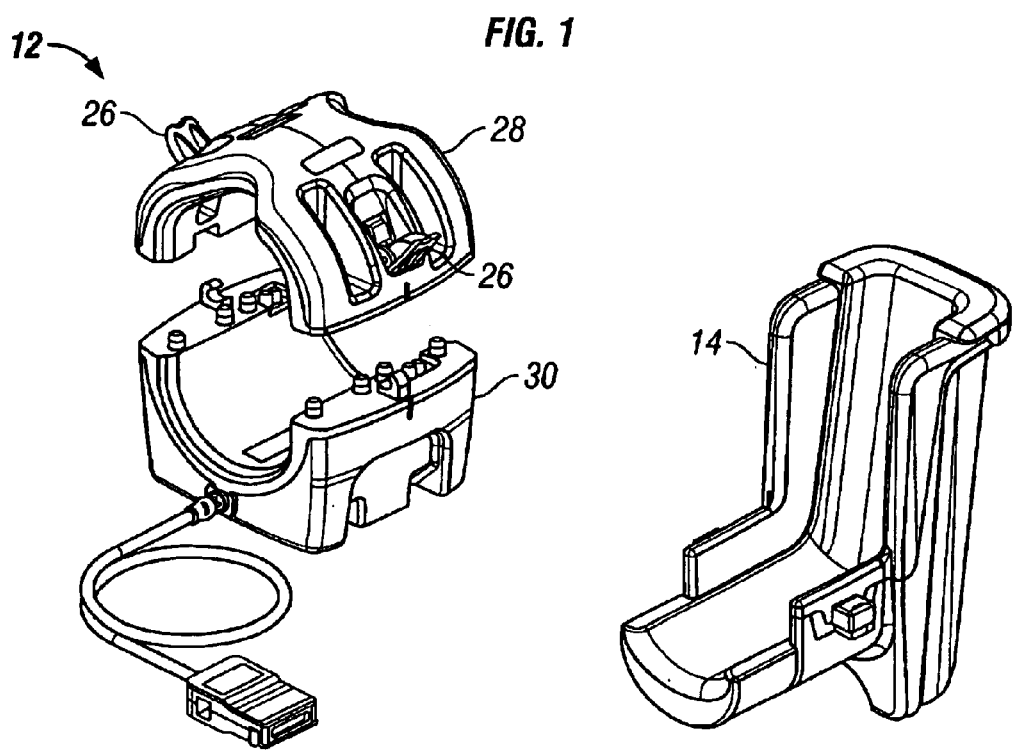
FIG. 2 is a perspective view of a knee coil section according to the invention showing the top and bottom halves separated.
Figure 3:
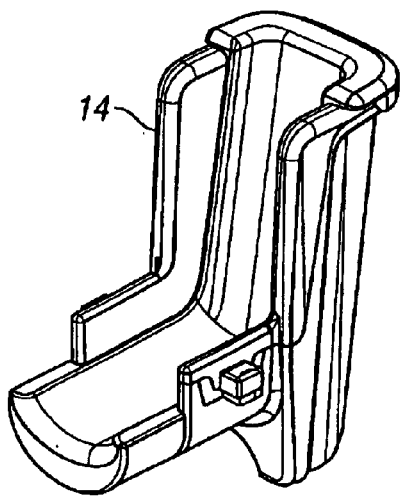
FIG. 3 is a perspective view of a foot/ankle coil section according to the invention.

When imaging the knee, the knee coil section 12 (FIG. 2) may be used alone without the foot/ankle coil section 14 (FIG. 3). When imaging the foot and ankle, both sections 12, 14 are used and combined as a single coil 10 (FIG. 1). The two individual sections 12, 14 are designed to be compatible with each other when they are used as a combination coil package. Each individual coil section or coil array can include of one, two, or more coil elements. Combined, the coil 10 allows MR imaging with all or a selected number of coil elements in both coil sections.

Figure 4:
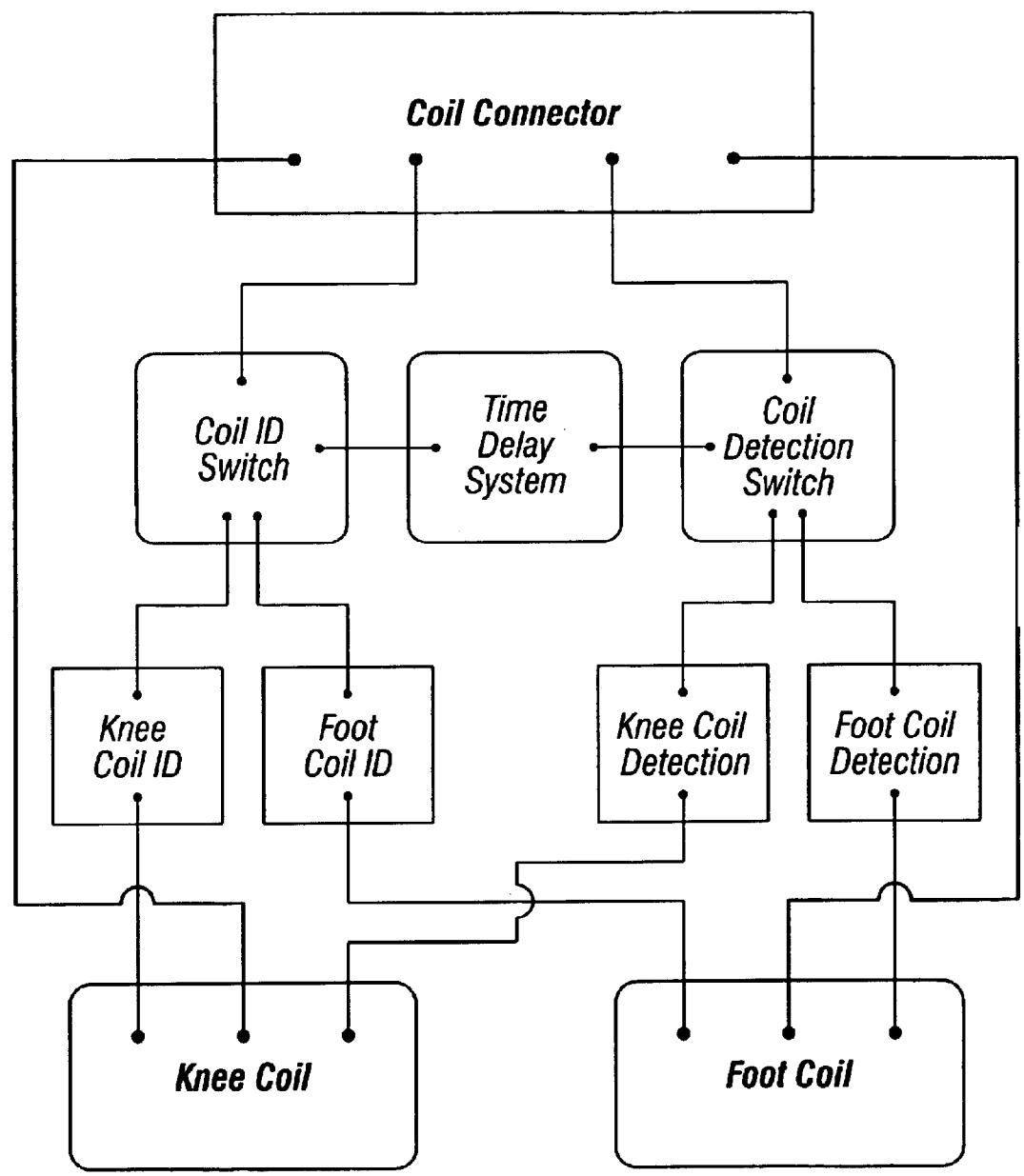
FIG. 4 is a schematic diagram of a call identification system according to the invention.

Referring FIG. 4, the total number of signal output cable assemblies can be one or two. In either case, the coil identification is changed by the "plug-in" of the foot/ankle coil section 14 into the knee coil section 12. This gives the coil identification of the combined coil 10 for foot/ankle imaging. When the foot/ankle coil section 14 is removed, the knee coil section 12 gives the coil identification as the knee coil section 12. This coil identification is read by the MRI system.

The coil 10 includes at least two RF coil elements: at least one coil element in the knee coil section 12 and at least one coil element in the foot/ankle coil section 14. Each coil element can also be a multi-element coil array. In a preferred embodiment, there are two quadrature coil elements in each of the coil sections 12, 14.

Referring to FIG. 5, the coil element 16 in the knee coil section 12 may be a modified two-turn solenoid that has the center section (the crossing area) of the coil bottom inductors dropped down or away from the knee. The two inductor turns are in series. The second coil element 18 in the knee coil section may be a modified saddle coil that also has the center section (the crossing area) of the coil bottom inductors dropped down or away from the knee. The two saddle coil turns are also in series.

Referring to FIG. 6, a coil element 20 in the foot/ankle coil section 14 may be a modified two-turn solenoid that has the heel section (the crossing area) of the coil bottom inductors dropped down or away from the heel. The element 20 may be provided with an extended portion 22 that aids in imaging the ankle and is designed to extend within the knee coil section 12 during imaging of the ankle. The two inductor turns of the element 20 are in series. The side view of the coil inductors is provided in FIG. 7. The angle A between the extended portion 22 and the foot section can be, for example, from 90 degrees to 110 degrees. The coil element 24 in the foot/ankle coil section 14 may be a bent single-turn or two-turn loop coil. The typical angle B of bending can be, for example, from 80 to 100 degrees. The bending occurs at just below the toes.

The knee coil section can be advantageously constructed with two halves (FIG. 2) (a split-top design). There may be two latch a levers 26 on the top half 28, one on each side, located at the center in the head-to-toe direction. To unlatch or unlock the top 28 from the bottom 30, the latch levers 26 are pulled outward. Then the top half 28 can be removed. To engage the top half 28 with the bottom 30 and lock the top 28 to the bottom 30, the top 28 is pushed downward and the latch levers 26 pushed inward. The latch levers 26 may be, for example, spring-loaded with elastic o-rings. In the locked position after the patient is positioned, the outer surface of the latch levers may be advantageously designed flush with the coil housing outer surface.

Figure 8:
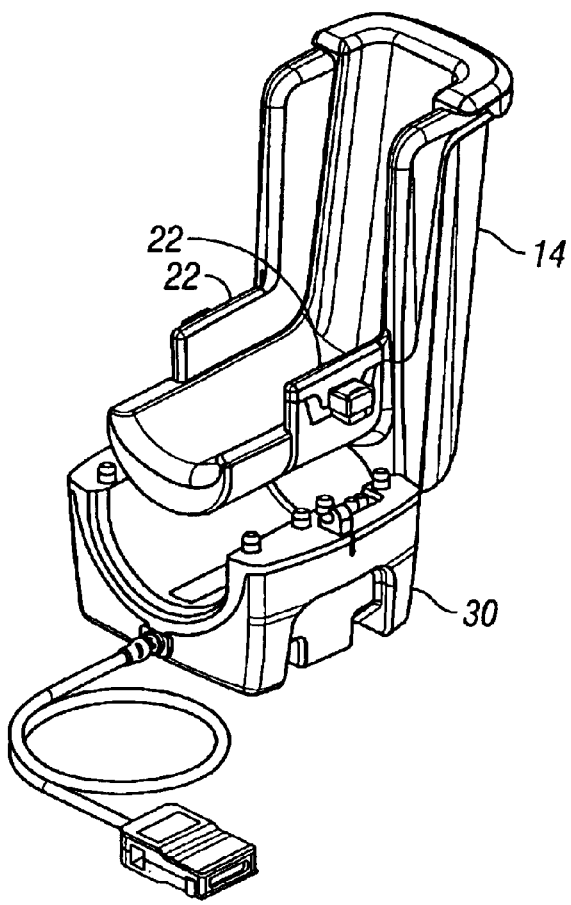
FIG. 8 is a perspective view of a foot/ankle section being inserted into the bottom half of a knee section of a coil according to the invention.
Figure 9:
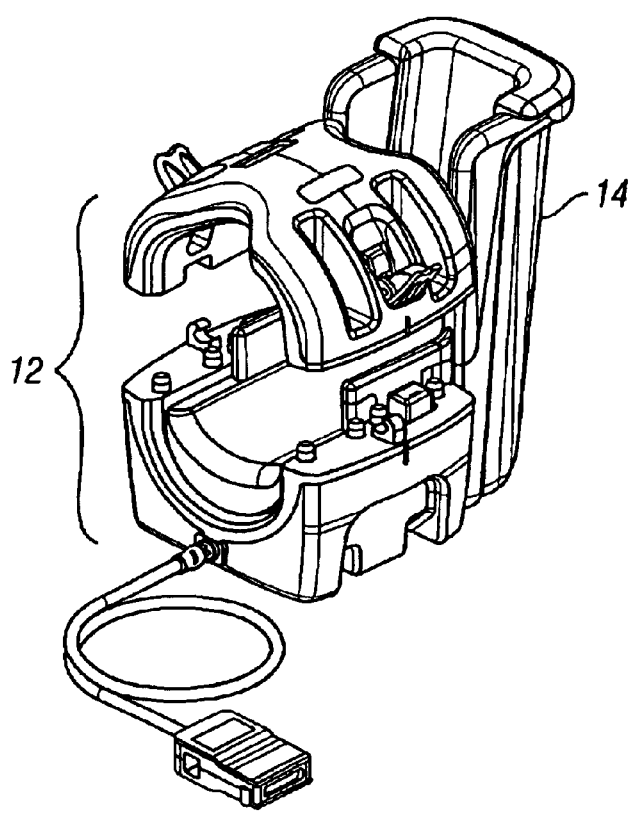
FIG. 9 is a perspective view of the top half of a knee section being assembled over a foot/ankle section of a coil according to the invention.

Referring to FIGS. 8 and 9, in the knee/foot/ankle combination coil configuration, the portion 22 or the ankle portion of the foot/ankle coil section 14 may be advantageously overlapped with the knee coil section 12. The overlapping section of the foot/ankle coil section 14 is placed inside the knee coil section 12. Two sets of push-on connectors can be provided between the foot/ankle coil and the bottom half of the knee coil and multiple (two or more) electrical contacts within each set of connectors. There may be one set of connectors on each side of the coils. The use of the knee section 12 further increases the coverage of the ankle in this combination configuration. After the foot/ankle coil is engaged with the bottom half of the knee coil, the patient's foot and ankle will be positioned properly. Then, the top half 28 of the knee coil section 12 may be put on and locked into position before imaging.

The foot/ankle coil section 14 may be shaped like a shoe with the front open. The addition of the knee coil section 12 make the coil 10 boot-like. It is possible to design some mechanical members such as bars in the open front of the foot/ankle section 14 for different inductor designs. However, the members should be removable or opened easily for patient positioning or accepting the foot. After patient positioning, the members need to be replaced back before imaging. To immobilize the foot and ankle, soft foam pads may be used.

The coil 10 may be used to perform MRI imaging by using the knee section 12 or the foot/ankle coil section 14 independently. The two coil sections may be designed in such a way that they can be quickly disconnected from each other and either one of the coil arrays can be plugged in the MRI system by using an adapter and cable assembly. This feature allows one of the two coil sections to be used as an independent RF coil for more clinical applications.

The coil 10 optimizes the image quality in all the three anatomical regions, knee, foot and ankle.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A MRI RF coil for use on a human leg having a knee, ankle, and foot, said coil comprising:
   a knee section, and
   an L-shaped foot/ankle section, wherein said foot/ankle coil section has an extended coil portion that is operably receivable within said knee coil section, said sections being configurable into a boot-like structure.

2. A MRI RF coil according to claim 1, wherein said knee coil section includes a quadrature coil pair and said foot/ankle coil section includes a quadrature coil pair.

3. A MRI RF coil according to claim 1, wherein said knee coil section is configurable to separately image a knee.

4. A MRI RF coil according to claim 3, further comprising a coil identification system adapted to provide electrical indication of the configuration of said coil sections.

5. A MRI RF coil according to claim 1, wherein said knee coil section comprises a top portion and a bottom portion.

* * * * *